US008293608B2

(12) United States Patent
Orlowski et al.

(10) Patent No.: US 8,293,608 B2

(45) Date of Patent: Oct. 23, 2012

(54) INTERMEDIATE PRODUCT FOR A MULTICHANNEL FET AND PROCESS FOR OBTAINING AN INTERMEDIATE PRODUCT

(75) Inventors: Marius Orlowski, Meylan (FR); Andreas Wild, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 262 days.

(21) Appl. No.: 12/865,517

(22) PCT Filed: Feb. 8, 2008

(86) PCT No.: PCT/IB2008/051775

§ 371 (c)(1), (2), (4) Date: Jul. 30, 2010

(87) PCT Pub. No.: WO2009/098548

PCT Pub. Date: Aug. 13, 2009

(65) Prior Publication Data

US 2011/0003451 A1 Jan. 6, 2011

(51) Int. Cl.
*H01L 21/20* (2006.01)

(52) U.S. Cl. .......... 438/285; 438/478; 438/197; 257/19; 257/183; 257/635; 257/E21.409

(58) Field of Classification Search .................. 438/478, 438/197, 284, 285; 257/19, 183, 635, E21.409
See application file for complete search history.

(56) References Cited

U.S. PATENT DOCUMENTS

| | | | | |
|---|---|---|---|---|
| 6,855,583 | B1 * | 2/2005 | Krivokapic et al. | 438/157 |
| 2005/0023619 | A1 * | 2/2005 | Orlowski et al. | 257/401 |
| 2005/0127392 | A1 * | 6/2005 | Chu et al. | 257/103 |
| 2005/0158934 | A1 * | 7/2005 | Yun et al. | 438/197 |
| 2005/0158937 | A1 * | 7/2005 | Yang et al. | 438/199 |
| 2005/0224889 | A1 * | 10/2005 | Oh et al. | 257/369 |
| 2006/0216897 | A1 * | 9/2006 | Lee et al. | 438/282 |
| 2007/0029586 | A1 * | 2/2007 | Orlowski | 257/287 |
| 2007/0126035 | A1 * | 6/2007 | Ernst et al. | 257/288 |
| 2007/0166960 | A1 * | 7/2007 | Ponomarev | 438/478 |
| 2008/0296615 | A1 * | 12/2008 | Savage et al. | 257/190 |

FOREIGN PATENT DOCUMENTS

WO WO2005/064686 * 7/2005

OTHER PUBLICATIONS

Jurczak Malgorzata et al "Silicon-on-Nothing (SON)—an Innovative Process for Advanced CMOS"; IEEE Transactions on Electron Devices, vol. 47, No. 11, Nov. 2000; pp. 217-2187.*

Caubet et al Impact of Tunnel Etching Process on Electrical Performances of SON Devices; JPn. J. Appl Phys. 44 Jul. 26, 2005, 1 page.*

Boeuf F. et al, "16nm planar NMOSFET manufactuble within stat-of-the-art CMOS process . . . optimisation", 2001 IEEE, IEDM 01-637; pp. 29.5.1-29.5.4.*

(Continued)

*Primary Examiner* — Michael Trinh

(57) ABSTRACT

An intermediate product in the manufacture of a vertical multiple-channel FET device containing alternating —Si—[(SiGe)—Si]u- stacked layers is shown, as well as a process for selectively etching the SiGe layers in such a stacked layer system, and products obtained from such selective etching. Differential Ge content is added to the successive layers to provide uniform removal of the sacrificial SiGe layers.

20 Claims, 4 Drawing Sheets

Nitride Cap 26
Si 24
$Si_{x-y_2}Ge_{1-x+y_2}$ 22-2
Si 20-2
$Si_{x-y_1}Ge_{1-x+y_1}$ 22-1
Si 20-1
$Si_xGe_{1-x}$ 18
Si 16
BOX 14

Nitride Cap 26
Si 24
$Si_{x-y_2}Ge_{1-x+y_2}$ 22-2e
Si 20-2
$Si_{x-y_1}Ge_{1-x+y_1}$ 22-1e
Si 20-1
$Si_xGe_{1-x}$ 18e
Si 16
BOX 14

OTHER PUBLICATIONS

Monfray S. et al "SON (Silicon-On-Nothing) technological CMOS Platform: Highly performant devices and SRAM cells", IEDM-04-635, IEEE 2005; pp. 27.3.1-27.3.4.*

Monfray S. et al "50nm—Gate All Round (GAA)—Silicon on Nothing (SON)—Devices: A Simple Way to Co-integration of GAA Transistors within bulk MOSFET process", 2002 Symposium on VLSI Technology Digest of Technical Papers; pp. 108-109.*

* cited by examiner

$Si_{70}Ge_{30}$ etched 4x30s

$Si_{70}Ge_{30}$ etched 2min

INTERMEDIATE PRODUCT FOR A MULTICHANNEL FET AND PROCESS FOR OBTAINING AN INTERMEDIATE PRODUCT

FIELD OF THE INVENTION

The present invention relates to an intermediate product in the manufacture of a vertical multiple-channel FET device containing alternating —Si—[(SiGe)—Si]$_u$— stacked layers, a process for selectively etching the SiGe layers in such a stacked layer system, and intermediate and final products obtained via processes including such selective etching.

BACKGROUND TO THE INVENTION

Multichannel Field Effect Transistor (FET) devices are known in the art. It is known to manufacture multichannel devices pursued using a selective removal of sacrificial epitaxial layers. Commonly these layers are either silicon-germanium (SiGe) or epitaxially grown silicon (Si epi) layers that can be etched isotropically and with high selectivity relative to Si or SiGe, respectively. The use of etchants that selectively etch SiGe with respect to Si in the fabrication of multichannel devices is described in Applicant's previous patents U.S. Pat. Nos. 6,921,700 and 7,112,832.

Also the SON (silicon on nothing) approach (see, for example, S. Monfray et al., IEDM 2004, 27.3.1-27.3.4 (635-638)) relies on a selective removal of SiGe epi layers relative to crystalline Si. In the last two years, the SON approach has been extended to multichannel devices.

However, the present inventors have now observed that proceeding according to currently known techniques for selective etching of SiGe layers in multiple stacked alternating —Si—[(SiGe)—Si]$_u$— layers (u=2 or more) leads to non-uniformity of selectively etched SiGe layers. This results in uncontrollable devices and dysfunctional circuits.

The situation according to present methods is illustrated schematically by FIGS. 1 and 2. FIG. 1 shows a known precursor of a multichannel device containing SiGe layers intercalated in between SiGe layers, the SiGe layers all having the same composition. This is described in Applicant's previous patents U.S. Pat. Nos. 6,921,700 and 7,112,832.

As shown schematically in FIG. 2 and through transmission electron microscopy (TEM) evidence in FIGS. 3 to 6, where the SiGe layers all have the same composition, non-uniformity in the lateral extent of SiGe etching is observed.

Without wishing to be bound by any particular theory, it is currently postulated by the inventors that the etch non-uniformity of SiGe layers at a constant Ge content is due to non-uniform stress distribution in the layer stack.

SUMMARY OF THE INVENTION

The present invention provides an iintermediate product, a process, a transistor, an integrated circuit and a use as described in the accompanying claims.

Specific embodiments of the invention are set forth in the dependent claims

These and other aspects of the invention will be apparent from and elucidated with reference to the embodiments described hereinafter.

BRIEF DESCRIPTION OF THE FIGURES

Further details, aspects and embodiments of the invention will be described, by way of example only, with reference to the drawings.

DETAILED DESCRIPTION OF THE INVENTION

Figure 1:
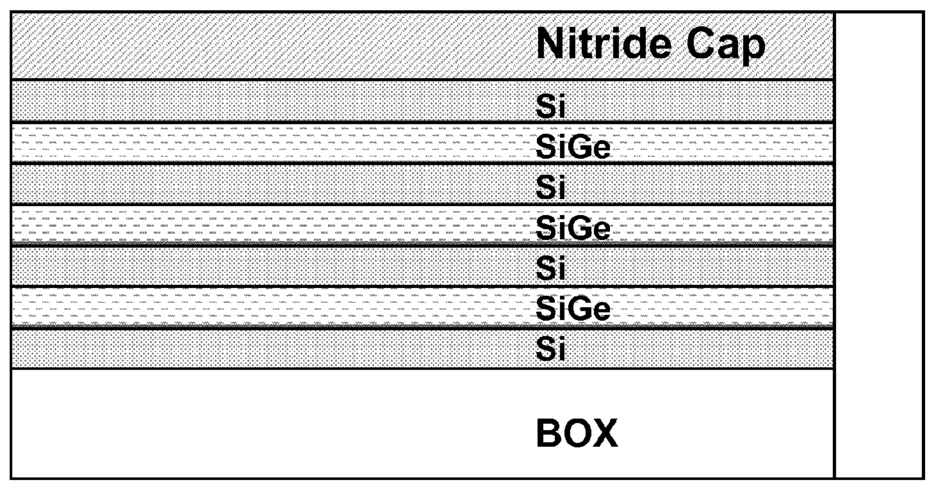
FIG. 1 schematically shows a known (prior art) precursor of a multichannel device containing SiGe layers intercalated in between SiGe layers, the SiGe layers all having the same composition.
Figure 2:
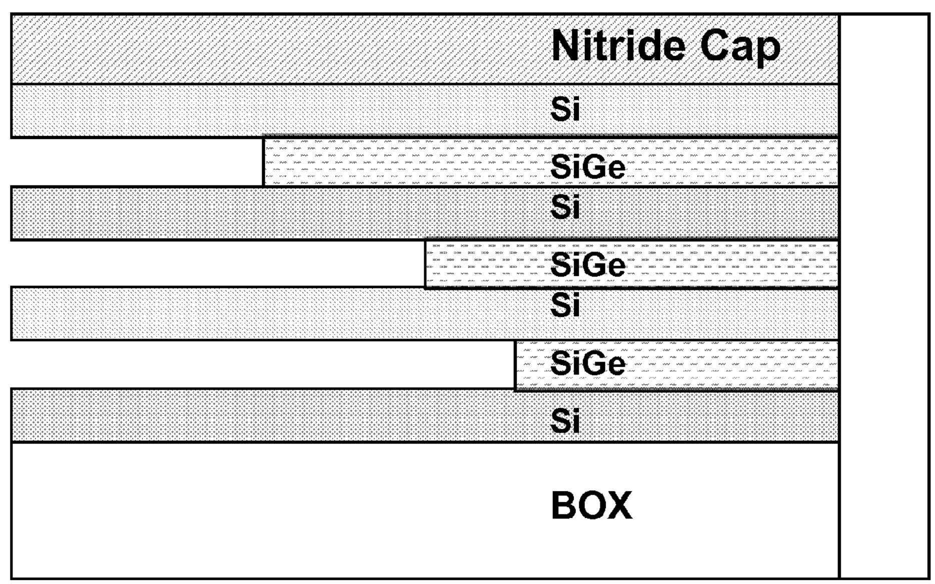
FIG. 2 shows the observed result of selective etching of SiGe layers and not Si layers in a prior art device according to FIG. 1.
Figure 3:
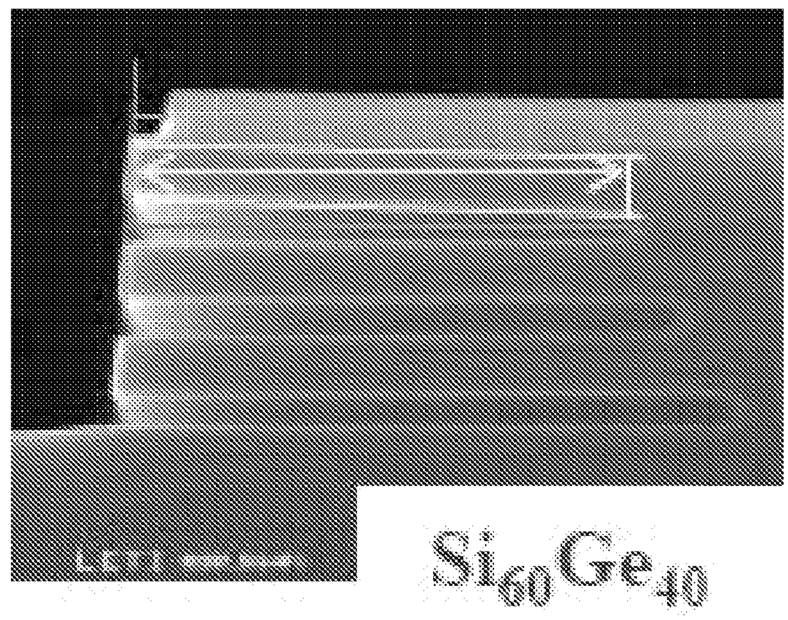
FIG. 3 and FIG. 4 show transmission electron microscope images obtained by etching of a prior art device according to FIG. 1 where all SiGe layers have formula $Si_{60}Ge_{40}$.
Figure 4:
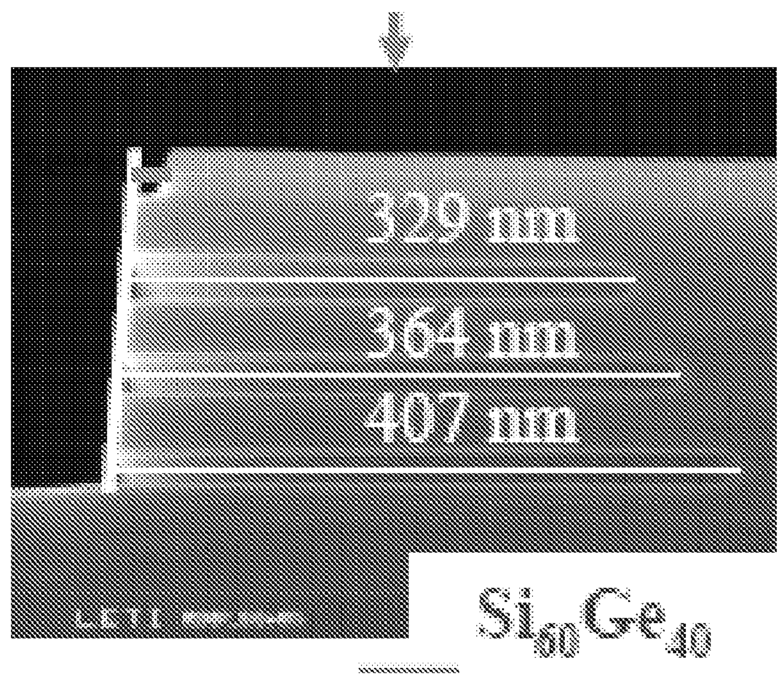
Figure 5:
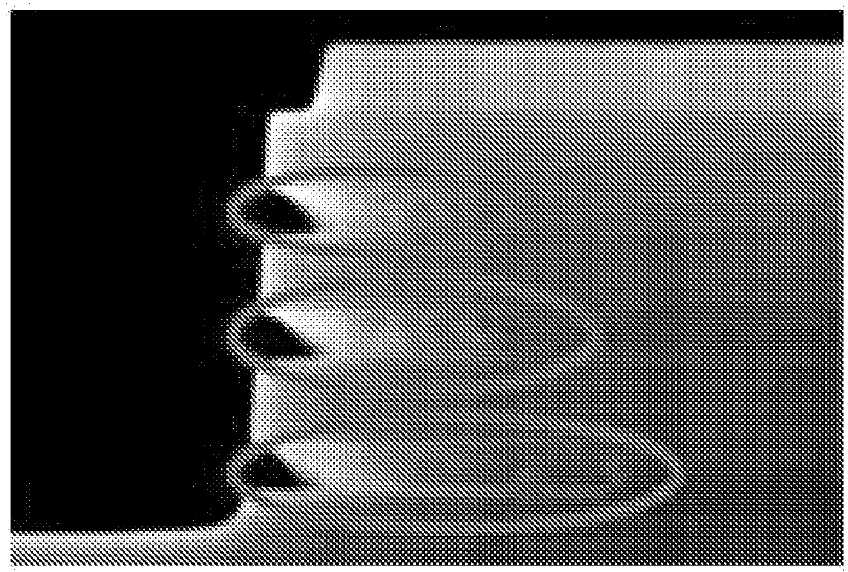
FIG. 5 show transmission electron microscope images obtained by etching of a prior art device according to FIG. 1 where all SiGe layers have formula $Si_{70}Ge_{30}$, the etching having been performed for four periods of 30 seconds.
Figure 6:
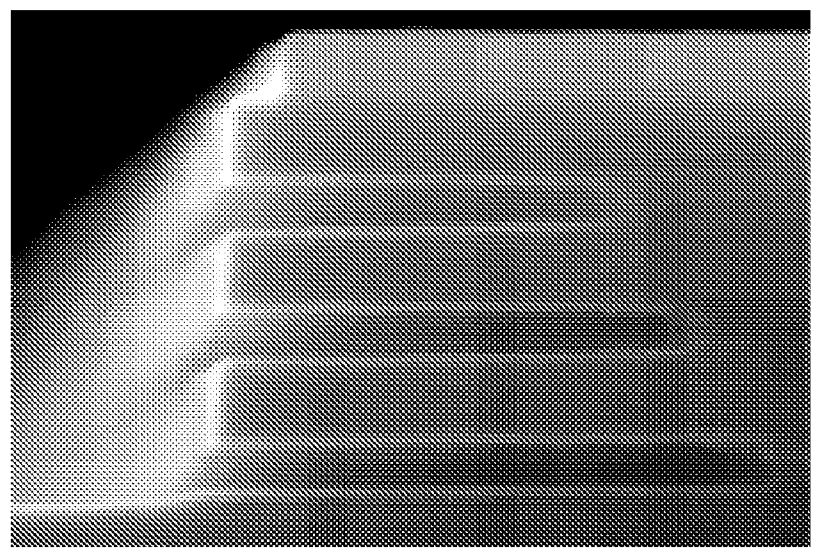
FIG. 6 shows analogous data obtained for a single etching period of 2 minutes applied to a prior art device according to FIG. 1.
Figure 7:
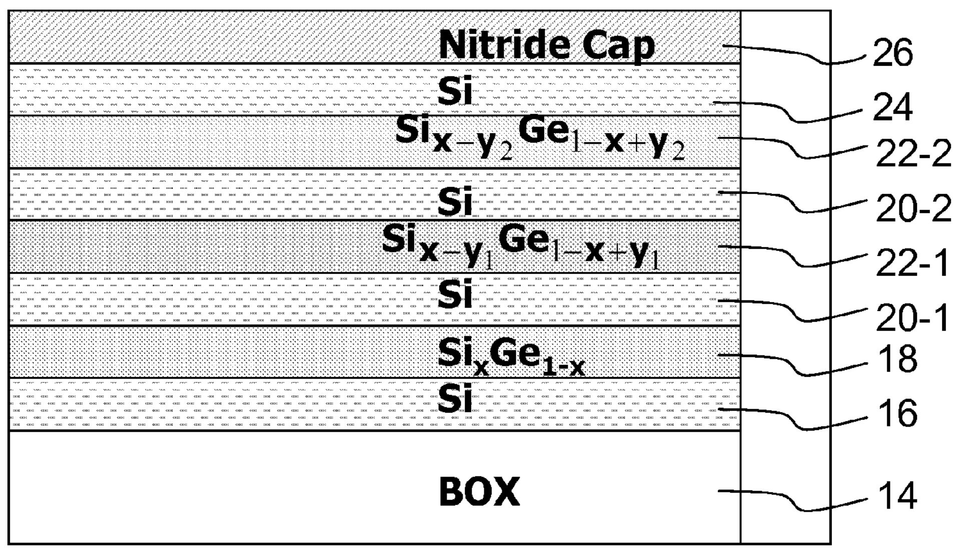
FIG. 7 is a schematic view of an initial stack of Si and SiGe layers in an example of an embodiment of a multichannel device precursor according to the present invention, prior to the selective etch step. The protective layer (also known in the art as a "masking layer" or "hard mask layer") shown by way of example in this example of the invention is a nitride cap, but any non-metallic oxide such as $SiO_2$, any metal oxide, boron nitride or thick photoresist layer could also be used here in the framework of the invention. Similarly, as an example of a suitable insulating layer (14), a buried oxide (BOX) is shown, but another insulating material such as sapphire ($Al_2O_3$) could also be used. The silicon-germanium (Si—Ge) layer (22-n) layers have substantially, i.e. appropriately with a variation of within 1 nm, the same breadth in the planes of the stacked layers as the silicon (Si) layers (16, 20-n, 24).
Figure 8:
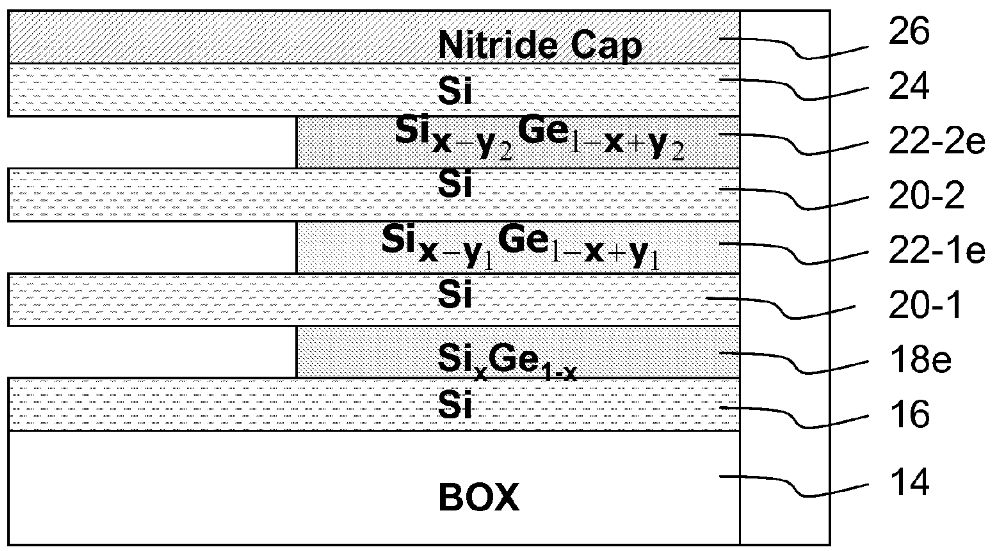
FIG. 8 is a schematic view of an initial stack of Si and SiGe layers in an example of an embodiment of a multichannel device precursor according to the present invention, after the selective etch step. Silicon layers (16), (20-n) (i.e. (20-1), (20-2)), and (20-4) are in principle not or little affected by the selective etch process designed to etch only SiGe layers as far as possible. The illustrative nitride cap (26) and BOX insulating layer (14) should also not be affected. The SiGe layers have however been etched to give rise to layers (18*e*), (22-1*e*) and (22-2*e*).

An example of an embodiment, a solution to the above-mentioned problem of non-uniformity of etching of SiGe layers in a stack of alternating Si and SiGe layers, which may be grown by epitaxy, may involve compensating the stress effects by differential Ge content added to the successive layers. It has been found that this can solve the problem of lack of uniformity in etching and provide uniform removal of the sacrificial SiGe layers.

To address the etch non-uniformity issue it is proposed to increase the Ge content in the successive sacrificial SiGe layers to compensate for the lower etch rate at the upper SiGe layers. Higher Ge content is observed to increase the etch rate.

In an embodiment, the bottom SiGe layer may be deposited with a Ge content of (1−x), (where 1−x is in the range of 0.15 to 0.40, i.e. the content of Ge is 15% to 40%). A SiGe alloy having a Ge content where $(1-x)\geqq 0.05$ will appropriately be used, and more appropriately $(1-x)\geqq 0.15$, because the selectivity of the etching with respect to Si increases with the increase of Ge content in the alloy. For each successive SiGe layer the Ge content may thus be increased by an increment of $y_1, y_2, y_3$ etc., where $0<y_1<y_2<y_3$. It is thought, without wishing to be bound by any particular theory, that the increase of Ge content will increase the etch rate and compensate the etch rate reduction due to stress.

In an embodiment, the first SiGe layer may have a Ge content (1−x) of 0.2 (20%), the second SiGe layer may have a Ge content between 23%-25%, the third SiGe layer may have a Ge content between 26%-29% and so on. The percentages given here are atom percentages: $Si_{70}Ge_{30}$ or $Si_{0.7}Ge_{0.3}$ means that for 70 Si lattice atoms there are 30 Ge lattice atoms.

In principle, the selectivity could be maximised and hence the etch rate of the SiGe alloy increased by having the Ge concentration in the SiGe alloy greater than 50%. However, higher Ge concentrations (for example over 60%) may induce high mechanical stresses which could render the device inoperable because of the high level of defects or delamination effects.

One of the following etchants may then be used to etch selectively SiGe: a combination of carbon tetrafluoride $CF_4$, oxygen $O_2$, Argon Ar and nitrogen $N_2$. For example, a reactive ion plasma etch may be used to selectively etch the first SiGe layer with gases: $CF_4$, $O_2$, Ar. The following combination of gases may also be used in an etch process: $CF_4/CH_2F_2/N_2/O_2/Ar$. In another example, a solution of $HNO_3$ is used in the etch process. SiGe can be easily removed, either by oxidizing chemistry (such as by etching with a solution having 40 parts by volume of 70% $HNO_3$+20 parts by volume of $H_2O_2$+5 parts by volume of 0.5% HF). SiGe can be also selectively removed by isotropic plasma etching.

More information concerning selective etch processes that can be applied by one skilled in the art in the practice of the present invention can be found in the following articles: "Impact of Tunnel Etching Process on Electrical Performance of SON devices", by V. Caubet et al, Japanese Journal of Applied Physics, vol. 44, no. 7B, p. 5795-98, 2005; and "Silicon-on-Nothing (SON)-an innovative process for advanced CMOS" by Jurczak, M.; Skotnicki, T.; Paoli, M.; Tormen, B.; Martins, J.; Regolini, J. L.; Dutartre, D.; Ribot, P.; Lenoble, D.; Pantel, R.; Monfray, S published in IEEE Transactions on Electron Devices, vol. 47, Page(s): 2179-2187, 2000.

The degree of stepping up of Ge content, i.e. the difference between $y_1$ and $y_2$, or between $y_2$ and $y_3$ etc., may depend on the type of etchant solution. The difference between successive y values may appropriately lie in the range of between 2%-10% depending on the stress levels encountered in the stack. The right percentage may be adjusted by the skilled person empirically i.e. by experiment, with given stacking system dimensions and a given etchant solution, in order to minimize variations in etching depth between successive SiGe layers.

In principle, it would be of interest to remove the SiGe layers entirely during the selective etching of SiGe layers. However, overetching of the exposed Si is to be avoided and consequently it may be appropriate to accept a residual depth of SiGe in each SiGe layer after etching. A uniform recess of SiGe layers is desirable—a certain degree of inhomogeneity may of course be tolerated although it is an aim of the invention to reduce this as far as possible—a depth variation of less than 1 nm is appropriate. The depth of the etching will typically be in the range of 30 to 500 nm.

Concerning the thickness of the Si and SiGe and other layers, measured in the direction perpendicular to the planes of each of the stacked layers, in very broad terms the thickness of the Si and SiGe layers may be between 1 nm and 50 nm. In appropriate embodiments, it may be chosen between 10 nm and 40 nm.

As regards possible finishing manufacturing steps showing how the element described in the invention would be converted into a final product, after etching the cavities by removing the SiGe layers between Si layers, a gate dielectric may be formed over the exposed surfaces of epitaxial Si surfaces. Subsequently, a gate is formed over the dielectric gate filling the cavities entirely. In an embodiment, the gate dielectric is formed by a high temperature growth of silicon oxide. Other dielectric materials, such as metal oxides $HfO_2$ or $ZrO_2$, or any suitable high-k dielectric material, may alternatively be used. An appropriate deposition technique for the metal oxides is the atomic layer deposition technique (ALD) well known in the art. The gate may be formed of a conductive material such as polysilicon or polysilicon on metal. The source and drain regions are formed in conventional fashion as for a MOSFET device.

Epitaxy techniques known in the art may be used to construct each layer of the products of the invention. The deposition of epitaxial silicon is one of the most common CVD processes. The substrate and susceptor are heated to the appropriate temperature of 500° C. to 1100° C. A carrier gas such as $H_2$, He, Ar on $N_2$ is mixed with 0.1 top 1.0 mole-percent of volatile silicon compound such as $SiH_4$ (silane) or $Si_2H_6$ (disilane); other silicon compounds such as $SiCl_4$, $SiHCl_3$ or $SiH_2Cl_2$ can be also used. In case of SiGe epitaxy the carrier gas is mixed with volatile silicon compound and with a volatile germanium volatile compound such as germane ($GeH_4$). The ratio of the gas flow between silane and germane determines the relative content of Si and Ge in the SiGe epitaxial lattice.

The intermediate product in which the SiGe layers have been etched to substantially equivalent depth can be processed further in the production of a multichannel device. For example, the cavities left by etching of SiGe layers can be filled in with metal or polysilicon, in doped or undoped form, to provide a series of gate electrodes, alternating with silicon electrode layers. Edge cavities may be provided between the gate electrodes occupying spaces left by former SiGe regions, these edge cavities (which may be filled in with insulating material) functioning as spacers isolating source and drain regions from the gate. Source and drain regions may be appropriately doped by ion implantation according to known methods. Further conventional processing steps may be also be appropriately employed by those skilled in the art, such as thermal activation, silicidation of the source, drain and gate regions, and contact structure formation and metal interconnect.

In the foregoing specification, the invention has been described with reference to specific examples of embodiments. It will, however, be evident that various modifications and changes may be made therein without departing from the broader spirit and scope of the invention as set forth in the appended claims. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the words 'a' and 'an' shall not be construed as limited to 'only one', but instead are used to mean 'at least one', and do not exclude a plurality. The mere fact that certain measures are recited in mutually different claims does not indicate that a combination of these measures cannot be used to advantage.

The invention claimed is:

1. Intermediate product for the manufacture of a multiple-channel FET device, said intermediate product comprising a stack of semiconductor layers, said stack including:

(a) a first epitaxial silicon layer;

(b) a first epitaxial silicon-germanium layer which has a composition of formula $Si_xGe_{1-x}$, said first silicon-germanium layer overlying said first silicon layer;

($c_1$) a second epitaxial silicon layer overlying said first silicon-germanium layer;

($d_1$) a second epitaxial silicon-germanium layer overlying said second silicon layer, wherein said layer has a composition of formula $Si_{x-y_1}Ge_{1-x+y_1}$;

wherein layers ($c_1$) and ($d_1$) are followed in ascending order by one or more pairs of layers ($c_n$) and ($d_n$) consisting, respectively, of an epitaxial silicon layer and an epitaxial silicon-germanium layer of formula $Si_{x-y_n}Ge_{1-x+y_n}$, where n is a positive integer of at least 2;

wherein, in each SiGe layer, the Ge concentration is substantially constant throughout the layer;

wherein the values $y_n$ for all values of n are chosen such that $0<y_1<y_n<y_{n+1}$ and the difference in the percentage of Ge atoms between successive SiGe layers lies in the range of 2% to 10%, such that $(y_{n+1}-y_n)$ is comprised in the range 0.02 to 0.10.

2. Intermediate product as claimed in claim 1, including:

(e) a final silicon layer overlying the last silicon-germanium layer of formula $Si_{x-y_n}Ge_{1-x+y_n}$, where n is a positive integer of at least 1; and (f) a protective layer.

3. Intermediate product according to claim 2, wherein the protective layer is a nitride, a non-metallic oxide such as $SiO_2$, a metal oxide, boron nitride or thick photoresist layer.

4. Intermediate product according to claim 1, including an insulating layer which underlies said first silicon layer.

5. Intermediate product according to claim 4, where the insulating layer is buried silicon oxide, or sapphire ($Al_2O_3$).

6. Method of manufacturing a multiple-channel FET device, comprising the steps of:

(a) providing a first epitaxial silicon layer;

(b) forming over said first silicon layer a first epitaxial silicon-germanium layer which has a composition of formula $Si_xGe_{1-x}$;

($c_1$) forming a second epitaxial silicon layer over said first silicon-germanium layer;

($d_1$) forming a second epitaxial silicon-germanium layer over said second silicon layer, wherein said second silicon-germanium layer has a composition of formula $Si_{x-y_1}Ge_{1-x+y_1}$;

wherein ($c_1$) and ($d_1$) are repeated to form, in ascending order, one or more pairs of layers ($c_n$) and ($d_n$) consisting, respectively, of an epitaxial silicon layer and an epitaxial silicon-germanium layer of formula $Si_{x-y_n}Ge_{1-x+y_n}$, where n is a positive integer of at least 2;

wherein, in each SiGe layer, the Ge concentration is substantially constant throughout the layer;

wherein the values $y_n$ for all values of n are chosen such that $0<y_1<y_n<y_{n+1}$ and the difference in the percentage of Ge atoms between successive SiGe layers lies in the range of 2% to 10%, such that $(y_{n+1}-y_n)$ is comprised in the range 0.02 to 0.10; and (e) in the structure resulting from steps (a) to (d1), etching all the SiGe layers selectively with respect to the Si layers in a common etching process.

7. Manufacturing method according to claim 6, where the etching step (b) involves the use of a gas or plasma phase halogen-based agent such as $CF_4$ and/or $CH_2F_2$.

8. Manufacturing method according to claim 6, where the etching step (b) involves the use of an oxidizing liquid phase solution, containing one or more of $HNO_3$, $H_2O_2$ and HF.

9. The method of claim 6 wherein the etching includes etching the all the SiGe layers to a substantially equivalent depth.

10. The method of claim 6 further comprising:

after the etching the SiGe layers, forming a gate dielectric over exposed surfaces of silicon.

11. The method of claim 10 further comprising:

forming a gate material over the gate dielectric.

12. The method of claim 6 further comprising:

forming a source region and a drain region.

13. The method of claim 7 wherein the etching includes etching the all the SiGe layers to a substantially equivalent depth.

14. The method of claim 8 wherein the etching includes etching the all the SiGe layers to a substantially equivalent depth.

15. The method of claim 7 further comprising:

after the etching the SiGe layers, forming a gate dielectric over exposed surfaces of silicon.

16. The method of claim 8 further comprising:

after the etching the SiGe layers, forming a gate dielectric over exposed surfaces of silicon.

17. The method of claim 9 further comprising:

after the etching the SiGe layers, forming a gate dielectric over exposed surfaces of silicon.

18. The method of claim 17 further comprising:

forming a gate material over the gate dielectric.

19. The method of claim 7 further comprising:

forming a source region and a drain region.

20. The method of claim 8 further comprising:

forming a source region and a drain region.

* * * * *